Figure 1:
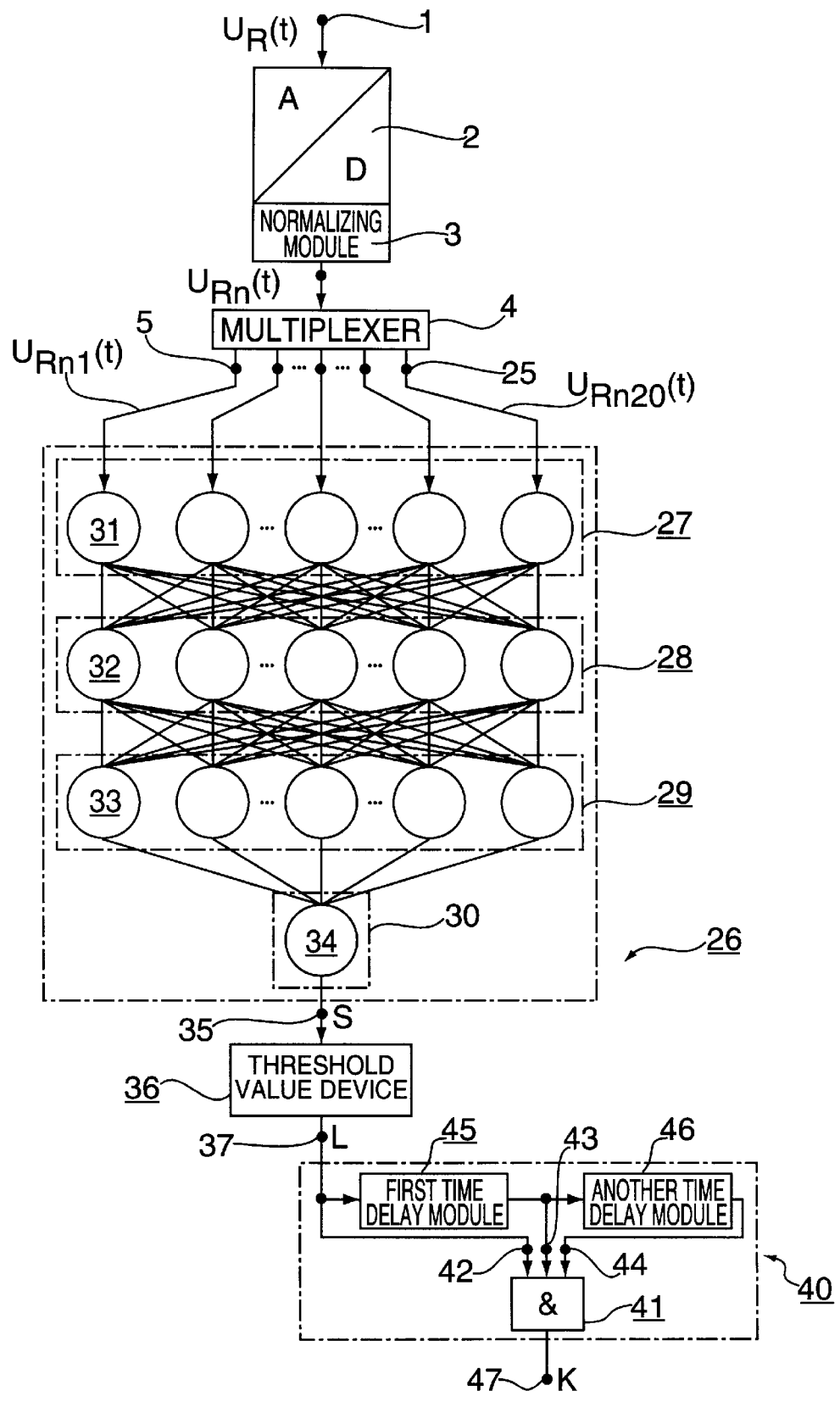

United States Patent [19]
Dalstein

[11] Patent Number: 5,854,590
[45] Date of Patent: Dec. 29, 1998

[54] METHOD FOR GENERATING A FAULT INDICATION SIGNAL

[75] Inventor: Thomas Dalstein, Berlin, Germany

[73] Assignee: Siemens Aktiengesellschaft, Munich, Germany

[21] Appl. No.: 619,742

[22] PCT Filed: Sep. 20, 1994

[86] PCT No.: PCT/DE94/01137

§ 371 Date: May 24, 1996

§ 102(e) Date: May 24, 1996

[87] PCT Pub. No.: WO95/09463

PCT Pub. Date: Apr. 6, 1995

[30] Foreign Application Priority Data

Sep. 27, 1993 [DE] Germany ............... 43 33 257.9

[51] Int. Cl.⁶ .................................................. G08B 21/00
[52] U.S. Cl. ..................... 340/650; 340/635; 361/115; 324/521; 395/22
[58] Field of Search .................... 340/635, 650; 361/115; 324/509, 521, 536; 395/22

[56] References Cited

U.S. PATENT DOCUMENTS 5,625,751  4/1997  Brandwajn et al. ................ 395/22

Primary Examiner—Jeffery A. Hofsass
Assistant Examiner—Anh La
Attorney, Agent, or Firm—Kenyon & Kenyon

[57] ABSTRACT

The invention concerns a method for generating a fault indication signal in the event of a fault in an electric power supply network being monitored through a neural network arrangement. In order to rapidly generate fault indication signals capable of distinguishing between permanent metal contact short-circuits and short circuits due to arcing, a neural network (26) is used for each phase of the power supply network being monitored. Each neural network (26) is taught, while being coached through simulated voltages ($U_R(t)$) of each phase during short-circuits caused by metal contact and arcing, so that the output signal (S) assumes a pre-defined value (0.8) for arcing and another pre-defined value (0.1) for a metal contact short-circuit. At the same time, the sequentially sampled normalized values ($U_{Rn1}(t)$ through $U_{Rn20}(t)$) of the respective phase voltages ($R_R(t)$) of the power supply network are applied to the different neurons (31) of the input layer (27) of each neural network (26) at the same time.

4 Claims, 1 Drawing Sheet

METHOD FOR GENERATING A FAULT INDICATION SIGNAL

The invention concerns a method for generating a fault indication signal in the event of a fault in an electric power supply network being monitored, through a multilayer neural network arrangement which is taught, while being coached during simulated permanent and transient faults, so that it emits an output signal having a pre-defined value for permanent faults and an output signal having another pre-defined value for transient faults.

A prior art method of this type is described in Proceedings No. 368 of the Fifth International Conference on Developments in Power System Protection, York (Great Britain), Mar. 30/Apr. 1st, 1993. This prior art method is based on the recognition that, when a power circuit breaker is switched following a fault detected in the respective power supply network, signals with different frequency spectra can be detected. The different frequency spectra can be assigned to different faults in the power supply network being monitored, so that distinction can be made between the different faults regarding whether they are permanent or transient faults between a phase of the power supply network and the ground. To distinguish between permanent and transient faults between a phase and the ground, the signal that can be detected as the circuit breaker is switched is subjected to a fast Fourier transformation, and subsequently the digital values obtained are supplied to a neural network arrangement. The neural network arrangement is previously taught by simulation, using Rumelhart's backpropagation algorithm, in a suitable manner and, when used for generating a fault recognition signal, responds to a fault in a power supply network by producing a signal at its output whose magnitude allows one to distinguish between a permanent and a transient fault. An output signal with a pre-defined value would then signify a permanent fault, while an output signal with another transient value would signify a transient fault. The distinction between permanent and transient faults is important, because in the case of a transient fault the power company can reclose the circuit breaker after a certain waiting period, so that power is subsequently restored.

The prior art method can only be used for distinguishing between permanent and transient faults when these faults are faults occurring between a phase of the power supply network being monitored and the ground. The prior art method also requires a relatively long time for a fault indication signal to be generated, since the signals that can be detected as the circuit breaker switches must first be subjected to a fast Fourier transformation, which must be carried out during at least one cycle of the power supply network's voltage. The object of the invention is to provide a method for generating a fault indication signal allowing generation of a fault indication signal in a relatively short time even for very different cases of fault in the power supply network being monitored.

To achieve this object, in a process of the aforementioned type according to the invention, a neural network arrangement having a neural network for each phase of the power supply network being monitored is used for distinguishing between a short circuit due to arcing and a metal contact short-circuit, and each neural network has a behavior taught through simulated voltages of each phase, while being coached during arcing and metal contact short-circuits, so that an output signal with a pre-defined value appears in the case of a short circuit due to arcing and an output signal with another pre-defined value appears in the case of metal contact short-circuit; at the same time, sequentially sampled normalized values of the respective phase voltages of the power supply network are applied to different neurons of the input layer of each neural network.

An important advantage of the method of the invention is the fact that it allows a fault indication signal, whose magnitude allows distinction to be made between a metal contact short-circuit and a short circuit due to arcing, to be generated in a relatively short time after a short-circuit appears. In the method according to the invention, the generation of fault indication signal begins as soon as it is determined that a short-circuit has occurred in the network being monitored; i.e., in the method of the invention there is no waiting period until the respective circuit breaker starts operating. This is made possible by the method of the invention by monitoring the voltages of the power supply network phases and using them directly for generating the fault indication signal. In the method of the invention, the fact that in the case of a short circuit due to arcing an approximately rectangular additive voltage whose polarity is reversed every time the phase current passes through zero can be detected in the respective phase, is taken into account. In the case of a metal contact short-circuit, the phase voltage that can be detected has an approximately sinusoidal shape. Another important advantage of the method of the invention is seen in the fact that it allows a fault indication signal to be generated not only in the case of single-pole short-circuits, but also for multi-pole short-circuits, for example, between two phases of the power supply network being monitored.

Neural networks with different designs can be used in the method of the invention. Considering, on the one hand, the lowest possible cost and, on the other hand, sufficient accuracy, it has proven to be advantageous to use an input layer with 20 neurons, a first hidden layer with 15 neurons, and a second hidden layer with 10 neurons, as well as an output layer with a single neuron for each neural network; during a time period corresponding to one voltage cycle, twenty sampled values of each voltage are obtained, and the last 20 sampled and normalized voltage values of the respective phase are applied to the neurons of the input layer. The method of the invention can be carried out with particular reliability when it is verified, in a post-processing device connected downstream from each neural network and containing at least two time delay modules and an AND element, whether the fault indication signal at the output of the respective neural network has occurred at least a total of three times.

To explain the invention, FIG. 1 shows an example of embodiment of an arrangement for carrying out the method of the invention concerning the analysis of the phase voltage of a power supply network being monitored. Sampled values $U_R(t)$, obtained by sampling the voltage on phase R of a power supply network being monitored (not illustrated) are supplied to an input 1 of the arrangement illustrated in the figure. The sampled values $U_R(t)$ are converted to the corresponding digital values in an analog-digital converter 2 on the input side, and the digital values are converted into normalized sampled values $U_{Rn}(t)$ in a normalizing module 3 connected downstream.

Normalized sampled values $U_{Rn}(t)$ are then supplied to multiplexer 4, which forwards the twenty phase R voltage values sequentially sampled and normalized during a voltage cycle to twenty outputs 5 through 25 through internal time delay modules (not illustrated) so that the twenty sequentially sampled values $U_{Rn1}(t)$ through $U_{Rn20}(t)$ are obtained at outputs 5 though 25 at the same time. Therefore, for a power supply network frequency of 50 Hz, the phase R voltage of the power supply network being monitored is sampled with a frequency of 1 kHz. The normalized sampled values $U_{Rn1}(t)$ through $U_{Rn20}(t)$ appearing at outputs 5 through 25 of multiplexer 4 are supplied to the input of a neural network 26, having an input layer 27, a first hidden layer 28, a second hidden layer 29, and an output layer 30. Input layer 27 is provided with 20 neurons 31, of which only five neurons are shown in the figure for better clarity. Each neuron 31 of input layer 27 is connected to one of outputs 5 through 25 of multiplexer 4. On the output side, each neuron 31 of input layer 27 is connected to the inputs of all neurons 32 of the first hidden layer 28, of which again only five of the total of 15 neurons of the first hidden layer 28 are shown in the figure for better clarity. The second hidden layer 29 of neural network 26 is provided with 10 neurons 33, of which again only five are shown. All the neurons 33 of the second hidden layer 29 are connected to all the neurons 32 of the first hidden layer. Output layer 30 of neural network 26 contains only a single neuron 34, whose output also forms the output 35 of the neural network 26. Neural network 26 has been taught by simulating different types of short circuits due to arcing and metal contact short-circuits in a power supply network being monitored; in the present case a NETOMAC network model, described in more detail in the journal "Elektrizitatswirtschaft," 1979, Vol. 1, pp. 18 through 23, was used. The network was taught using Rumelhart's backpropagation algorithm. In particular, the network was taught by creating a fault indication signal S with a pre-defined value of 0.8 or higher at output 35 for arcing, while a fault indication signal S with another pre-defined value of approximately 0.1 is present for a metal contact short-circuit.

A threshold value device 36 is connected to output 35, set to provide a signal L for a fault indication signal of 0.8 or higher at its output 37, denoting arcing. To produce a fault indication signal with an especially high reliability, a post-processing device 40 comprising, among other things, an AND element 41 with three inputs 42, 43, and 44, is connected to output 37 of threshold value device 36. Input 42 of AND element 41 is directly connected to output 35 of neural network 26, while input 43 is connected to output 35 through first time delay module 45. Another time delay module 46 is connected upstream from input 44 of AND element 41; this time delay module 46, like first time delay module 45, is calibrated so that they cause a delay corresponding to one sampling step of the phase R voltage. This results in a fault indication signal K, indicating short-circuits due to arcing, being produced at output 47 of post-processing device 40 only when the same signal L appears three consecutive times at output 37 of threshold value device 36.

In a power supply network with three phases R, S, and T, an arrangement as shown in the figure is assigned to each phase. The outputs of the three arrangements corresponding to output 47 are connected to the inputs of an OR element, which produces a signal at its output when a short circuit due to arcing has been determined by one of the three arrangements. The power supply network can then be briefly interrupted by opening the circuit breaker only temporarily.

What is claimed is:

1. A method of generating a fault indication signal for an electric power supply network having a plurality of phases, said method comprising:

(a) sequentially sampling and normalizing voltage values of each of the phases of the electric power supply network;

(b) monitoring the electric power supply network with a neural network arrangement including a neural network for each of the phases; and (c) simultaneously supplying said sampled and normalized values to neurons of an input layer of each of said neural networks, wherein:

(i) each of said neural networks has been trained to generate (1) an output signal having a first predetermined value if a metal contact short-circuit fault occurs and (2) an output signal having a second predetermined value if an arcing short-circuit fault occurs, and (ii) said neural networks have been trained through simulated voltages for each of the phases by using (1) sinusoidal voltages to simulate a metal contact short circuit fault and (2) sinusoidal voltages with an approximately rectangular additive voltage to simulate an arcing short-circuit fault.

2. The method according to claim 1, wherein:

each of said neural networks comprises an input layer having 20 neurons, a first hidden layer having 15 neurons, a second hidden layer having 10 neurons and an output layer having a single neuron, 20 sampled and normalized values are obtained for each period corresponding to one cycle of voltages of the electric power network, and said step of simultaneously supplying said sampled and normalized values to each neural network includes supplying 20 previously sampled and normalized values to neurons of the input layer of each neural network and the same time a new 20 sample and normalized values are obtained.

3. The method according to claim 1, further comprising determining by a post-processing device whether an output signal has appeared at least three times at the output of a respective neural network, said post-processing device including at least two time delay modules and an AND element connected down stream from each of said neural networks.

4. The method according to claim 2, further comprising determining by a post-processing device whether an output signal has appeared at least three times at the output of a respective neural network, said post-processing device including at least two time delay modules and an AND element connected down stream from each of said neural networks.

* * * * *